US011551965B2

(12) United States Patent
Nguyen et al.

(10) Patent No.: US 11,551,965 B2
(45) Date of Patent: Jan. 10, 2023

(54) APPARATUS TO REDUCE POLYMERS DEPOSITION

(71) Applicant: Applied Materials, Inc., Santa Clara, CA (US)

(72) Inventors: Andrew Nguyen, San Jose, CA (US); Xue Chang, San Jose, CA (US); Shahid Rauf, Pleasanton, CA (US); Jason A. Kenney, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 606 days.

(21) Appl. No.: 16/657,604

(22) Filed: Oct. 18, 2019

(65) Prior Publication Data

US 2020/0185256 A1 Jun. 11, 2020

Related U.S. Application Data

(60) Provisional application No. 62/776,925, filed on Dec. 7, 2018.

(51) Int. Cl.
*H01L 21/687* (2006.01)
*H01L 21/683* (2006.01)
*H02N 13/00* (2006.01)

(52) U.S. Cl.
CPC .... *H01L 21/68721* (2013.01); *H01L 21/6833* (2013.01); *H01L 21/68735* (2013.01); *H02N 13/00* (2013.01)

(58) Field of Classification Search
CPC ........... H01L 21/6833; H01L 21/68721; H01L 21/68735; H02N 13/00
See application file for complete search history.

(56) References Cited

U.S. PATENT DOCUMENTS

| 6,344,105 | B1 * | 2/2002 | Daugherty | ........ H01L 21/68735 |
| | | | | 156/915 |
| 7,520,969 | B2 | 4/2009 | Miller | |
| 7,670,436 | B2 | 3/2010 | Miller et al. | |
| 9,476,122 | B2 | 10/2016 | Riker et al. | |
| 9,689,070 | B2 | 6/2017 | Rasheed et al. | |
| 9,978,569 | B2 | 5/2018 | Hawrylchak et al. | |
| 10,903,055 | B2 | 1/2021 | Mishra et al. | |
| 2002/0066531 | A1 * | 6/2002 | Ke | ...................... H01L 21/6833 |
| | | | | 156/345.1 |
| 2005/0155718 | A1 * | 7/2005 | Huang | .............. H01L 21/67069 |
| | | | | 216/34 |
| 2007/0209931 | A1 * | 9/2007 | Miller | ............... H01L 21/68735 |
| | | | | 204/298.11 |

(Continued)

*Primary Examiner* — Saul Rodriguez
*Assistant Examiner* — Brendan P Tighe
(74) *Attorney, Agent, or Firm* — Patterson + Sheridan, LLP

(57) ABSTRACT

Implementations of the present disclosure provide a process kit for an electrostatic chuck. In one implementation, a substrate support assembly is provided. The substrate support assembly includes an electrostatic chuck having a first recess formed in an upper portion of the electrostatic chuck. A process kit surrounds the electrostatic chuck. The process kit includes an inner ring and an outer ring disposed radially outward of the inner ring. The outer ring includes a second recess formed in an upper portion of the upper ring. The inner ring is positioned within and is supported by the first recess and the second recess. An upper surface of the inner ring and an upper surface of the outer ring are co-planar.

20 Claims, 6 Drawing Sheets

(56) References Cited

U.S. PATENT DOCUMENTS

2017/0011891 A1\* 1/2017 Hammond, IV ...... H01J 37/321
2018/0218933 A1\* 8/2018 Luere ................ H01L 21/68742
2020/0105508 A1 4/2020 Belau et al.
2021/0082737 A1\* 3/2021 Kim .................. H01L 21/67248

\* cited by examiner

APPARATUS TO REDUCE POLYMERS DEPOSITION

CROSS-REFERENCE TO RELATED APPLICATIONS

This application claims benefit of U.S. Provisional Application Ser. No. 62/776,925, filed Dec. 7, 2018, which is incorporated by reference in its entirety.

FIELD

Examples of the present disclosure generally relate to apparatuses for processing substrates, such as semiconductor substrates. More particularly, a process kit for an electrostatic chuck is disclosed.

BACKGROUND

In the processing of substrates, such as semiconductor substrates and display panels, a substrate is placed on a substrate support in a process chamber while suitable process conditions are maintained in the process chamber to deposit, etch, form layers on, or otherwise treat surfaces of the substrate. During etching processes, a plasma, which drives the etching process, may not be uniformly distributed across the substrate surface. The non-uniformity is particularly apparent at the edge of the substrate surface. This non-uniformity contributes to poor processing results. Thus, some process chambers use edge rings, which may also be referred to as a process kit ring, in order to increase plasma uniformity and improve process yield.

However, it has been observed that the etching process can result in accumulation of polymer material at the edge of the substrate surface. The polymer material may get stuck in the gap between the edge of the substrate and the process kit ring and diffuse into the electrostatic chuck of the substrate support. When the substrate is lifted up and/or the plasma is turned off, the polymer material may deposit back onto the substrate surface, thereby negatively affecting substrate processing.

Therefore, there is a need in the art for apparatuses that can address issues discussed above.

SUMMARY

In one implementation, a substrate support assembly is provided. The substrate support assembly includes an electrostatic chuck having a first recess formed in an upper portion of the electrostatic chuck. A process kit surrounds the electrostatic chuck. The process kit includes an inner ring and an outer ring disposed radially outward of the inner ring. The outer ring includes a second recess formed in an upper portion of the upper ring. The inner ring is positioned within and is supported by the first recess and the second recess. An upper surface of the inner ring and an upper surface of the outer ring are coplanar.

In another implementation, a substrate support assembly for processing a substrate is provided. The substrate support assembly includes a substrate support and an electrostatic chuck disposed on the substrate support. The electrostatic chuck includes a first recess formed in an upper portion of the electrostatic chuck. A process kit surrounds the electrostatic chuck. The process kit includes an inner ring and an outer ring disposed radially outward of the inner ring. The outer ring includes a second recess formed in an upper portion of the upper ring. The inner ring is positioned within and is supported by the first recess and the second recess. An upper surface of the outer ring is higher than an upper surface of the inner ring. A plurality of pumping channels are formed through the outer ring. The pumping channels are angled downwardly towards a direction away from the inner ring.

In yet another implementation, a method of removing particles from a substrate support surface includes arranging a top surface of an outer ring coplanar with a top surface of an inner ring. An outer ring is disposed radially outward of the inner ring. The outer ring includes a first upper surface and a second upper surface. The first upper surface is coplanar with the upper surface of the inner ring. A plurality of protrusions is symmetrically arranged on an inner ring. The plurality of protrusions utilized for positioning a substrate on a substrate surface. Pumping channels are arranged on the outer ring. The pumping channels are configured to pump unwanted material away from the substrate support.

BRIEF DESCRIPTION OF THE DRAWINGS

So that the manner in which the above recited features of the present disclosure can be understood in detail, a more particular description of the disclosure, briefly summarized above, may be had by reference to aspects of the disclosure, some of which are illustrated in the appended drawings. It is to be noted, however, that the appended drawings illustrate only typical aspects of this disclosure and are therefore not to be considered limiting of its scope, for the disclosure may admit to other symmetrically effective aspects.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Implementations of the present disclosure provide a process kit for a substrate support assembly that includes an electrostatic chuck that is disposed on a top surface of a substrate support. The process kit surrounds the electrostatic chuck and includes an inner ring and an outer ring that are concentrically positioned with respect to the substrate support. The upper surfaces of the inner ring and the outer ring can be coplanar or at different heights, and the outer ring may include pumping channels to help exhaust unwanted polymer material from edges of the process kit and the electrostatic chuck, thereby improving quality of the substrate and process yield.

Figure 1:
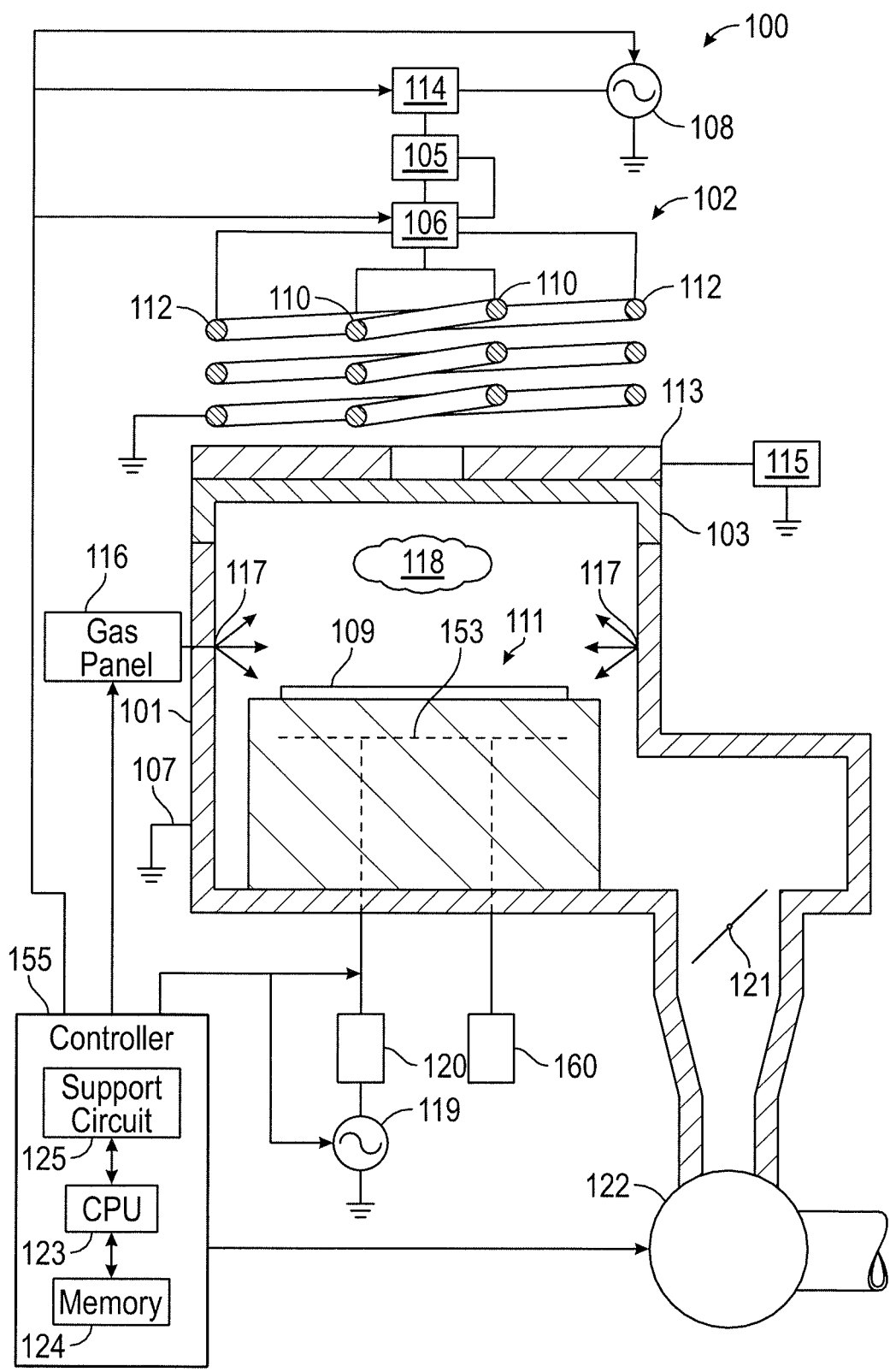
FIG. 1 is a schematic sectional view of a process chamber according to one example of the disclosure.

FIG. 1 is a schematic sectional view of a process chamber 100, according to one example of the disclosure. The illustrated process chamber 100 is suitable for etching, chemical vapor deposition (CVD), or other plasma-based processes. The process chamber 100 includes a chamber body 101 and a lid 103 disposed thereon. The chamber body 101 and the lid 103 together define an inner volume. The chamber body 101 is typically coupled to an electrical ground 107. A substrate support assembly 111 is disposed within the inner volume to support a substrate 109 thereon during processing. The process chamber 100 also includes an inductively coupled plasma apparatus 102 for generating a plasma within the process chamber 100, and a controller 155 adapted to control operations of the process chamber 100.

The substrate support assembly 111 includes one or more electrodes 153 coupled to a bias source 119 through a matching network 120 to facilitate biasing of the substrate 109 during processing. The bias source 119 may be a source of up to about 1000 W (but not limited to about 1000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 160 to facilitate chucking of the substrate 109 during processing. The substrate support assembly 111 includes a process kit (not shown) surrounding the substrate 109. Various implementations of the process kit will be described in more detail below.

The inductively coupled plasma apparatus 102 is disposed above the lid 103 and is configured to inductively couple RF power into the process chamber 100 to generate a plasma within the process chamber 100. The inductively coupled plasma apparatus 102 includes first and second coils 110, 112 disposed above the lid 103. The relative position, ratio of diameters of each coil 110, 112, and/or the number of turns in each coil 110, 112 can each be selected as desired to control the profile or density of the plasma being formed. Each of the first and second coils 110, 112 is coupled to an RF power supply 108 through a matching network 114 via an RF feed structure 106. The RF power supply 108 may be capable of producing up to about 4000 W (but not limited to about 4000 W) at a tunable frequency in a range from 50 kHz to 13.56 MHz, although other frequencies and powers may be utilized as desired for particular applications.

In some examples, a power divider 105, such as a dividing capacitor, may be provided between the RF feed structure 106 and the RF power supply 108 to control the relative quantity of RF power provided to the respective first and second coils. In some examples, the power divider 105 may be incorporated into the matching network 114.

A heater element 113 may be disposed atop the lid 103 to facilitate heating the interior of the process chamber 100. The heater element 113 may be disposed between the lid 103 and the first and second coils 110, 112. In some examples, the heater element 113 may include a resistive heating element and may be coupled to a power supply 115, such as an AC power supply, configured to provide sufficient energy to control the temperature of the heater element 113 within a desired range.

During operation, the substrate 109, such as a semiconductor wafer or other substrate suitable for plasma processing, is placed on the substrate support assembly 111 and process gases supplied from a gas panel 116 through entry ports 117 into the inner volume of the chamber body 101. Additionally or alternatively, the process gases may be supplied into the inner volume of the chamber body 101 through entry ports (not shown) disposed in the lid 103. In either case, the process gases are ignited into a plasma 118 in the process chamber 100 by applying power from the RF power supply 108 to the first and second coils 110, 112. In some examples, power from a bias source 119, such as an RF or DC source, may also be provided through a matching network 120 to electrodes 153 within the substrate support assembly 111. The pressure within the interior of the process chamber 100 may be controlled using a valve 121 and a vacuum pump 122. The temperature of the chamber body 101 may be controlled using liquid-containing conduits (not shown) that run through the chamber body 101.

The controller 155 is configured to control the operation of the process chamber 100 during processing. The controller 155 includes a central processing unit (CPU) 123, a memory 124, and support circuits 125 for the CPU 123 and facilitates control of the components of the process chamber 100. The controller 155 may be one of any form of general-purpose computer processor that can be used in an industrial setting for controlling various chambers and sub-processors. The memory 124 stores software (source or object code) that may be executed or invoked to control the operation of the process chamber 100 in the manner described herein.

Figure 2:
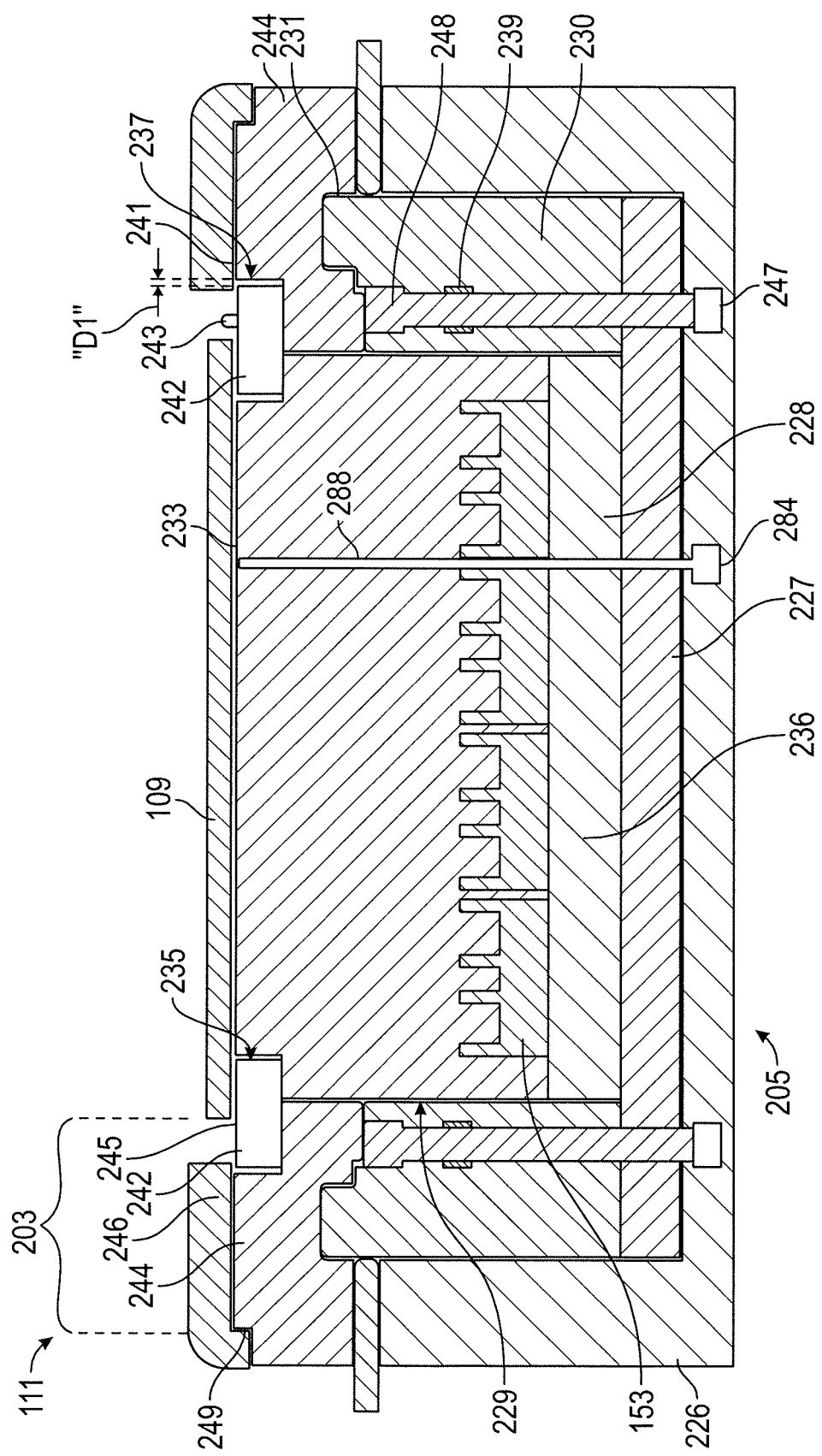
FIG. 2 is an enlarged schematic view of the substrate support assembly of process chamber according to one example described herein.

FIG. 2 is an enlarged schematic view of the substrate support assembly 111 of process chamber 100 according to one example described herein. The substrate support assembly 111 includes a process kit 203, a substrate support 205, and an electrostatic chuck 229. The electrostatic chuck 229 is disposed on a top surface of the substrate support 205 and surrounded by the process kit 203. The substrate support 205 includes a ground plate 226 surrounding an insulating plate 227 and a facilities plate 228 assembled in a vertical stack. The substrate support 205 further includes a sleeve 230 circumscribing the facilities plate 228 and the electrostatic chuck 229 to insulate the RF hot electrostatic chuck 229 from the ground plate 226. The sleeve 230 may be fabricated from quartz.

The facilities plate 228 is positioned above a lower portion of the ground plate 226 and between the insulating plate 227 and the electrostatic chuck 229. The electrostatic chuck 229 may include a plurality of electrodes 153 (four are shown) embedded in an insulating material 236. The electrodes 153 are coupled to the chucking power source 160 (shown in FIG. 1) to facilitate chucking of the substrate 109 to an upper surface 233 of the electrostatic chuck 229. One or more heating or cooling channels may optionally be formed in the insulating material 236 to facilitate temperature control of the substrate 109 during processing. In some aspects, the electrodes 153 are cathodes coupled through the matching network 120 to the bias source 119 (shown in FIG. 1).

The process kit 203 includes a cover ring 246, an inner ring 242, and an outer ring 244, which are arranged concentrically with respect to an axis passing through a center of the substrate support assembly 111. In some examples, the cover ring 246 is optional and may not be required. In cases where the cover ring 246 is used, the cover ring 246 can be positioned on an upper surface 241 of the outer ring 244. The cover ring 246 surrounds the radially-outward edges of the substrate 109. In some examples, the cover ring 246 is sized to abut against the edges of the substrate 109. The cover ring 246 facilitates protection of the edges of the substrate 109 during processing, and additionally, provides lateral support to the substrate 109 during processing. The cover ring 246 may be fabricated from quartz, silicon, or any other plasma-resistant material. The inner ring 242 may be fabricated from silicon or any other plasma-resistant material. In a particular example, the inner ring 242 is fabricated from silicon carbide (SiC). The outer ring 244 may be fabricated from quartz, silicon, or any other plasma-resistant material. In one example, the inner ring 242 is fabricated from silicon and the outer ring 244 is fabricated from quartz.

The outer ring 244 is disposed radially outward of the inner ring 242. The outer ring 244 is positioned on an upper surface of the vertical edge of the ground plate 226. The outer ring 244 includes a bottom recess 231 formed in a bottom surface of the outer ring 244 for engaging the sleeve 230. The outer ring 244 may also include an upper recess 249 formed in the upper surface 241 of the outer ring 244 to facilitate positioning of the cover ring 246. While the substrate 109 is shown to have the radially-outward edges extending over an upper surface 245 of the inner ring 242, it is contemplated that the radially-outward edges of the substrate 109 and the upper surface 245 may not overlap. That is, the radially-outward edges of the substrate 109 may stop at the edge of the upper portion of the electrostatic chuck 229.

The inner ring 242 is supported commonly by the electrostatic chuck 229 and the outer ring 244. The inner ring 242 is positioned in a way that the upper surface 245 of the inner ring 242 and the upper surface 241 of the outer ring 244 are coplanar. For example, a portion of the inner ring 242 is positioned within and supported by a recess 235 of the electrostatic chuck 229. The recess 235 may be formed in the outer periphery of the upper portion of the electrostatic chuck 229. The remainder of the inner ring 242 is positioned within and supported by a recess 237 of the outer ring 244. The recess 237 may be formed in the inner periphery of the upper portion of the outer ring 244. The top surface of the recess 235 and the top surface of the recess 237 are at the same elevation.

The upper surface 245 of the inner ring 242 and the upper surface 241 of the outer ring 244 are coplanar, or at the same height, to facilitate pumping of unwanted polymer materials (accumulated between the process kit 203 and the edges of the electrostatic chuck 229) to the vacuum pump 122 (see FIG. 1). The inner ring 242 may be stationary with respect to the substrate 109 during processing.

The radially-outward edge of the inner ring 242 may be separated from a vertical wall of the recess 237 by a gap "D1" to allow thermal expansion of the inner ring 242 and/or the outer ring 244. The gap "D1" may be in a range from about 0.002 inches to about 0.030 inches, for example about 0.010 inches to about 0.020 inches, which may vary depending on the material utilized for the inner and outer rings 242, 244. The size of gap "D1" can be chosen to prevent deposition of polymer material at the radially-outward edges of the inner ring 242. In some examples, the radially-outward edge of the inner ring 242 is in contact with the vertical wall of the recess 237.

Figure 3:
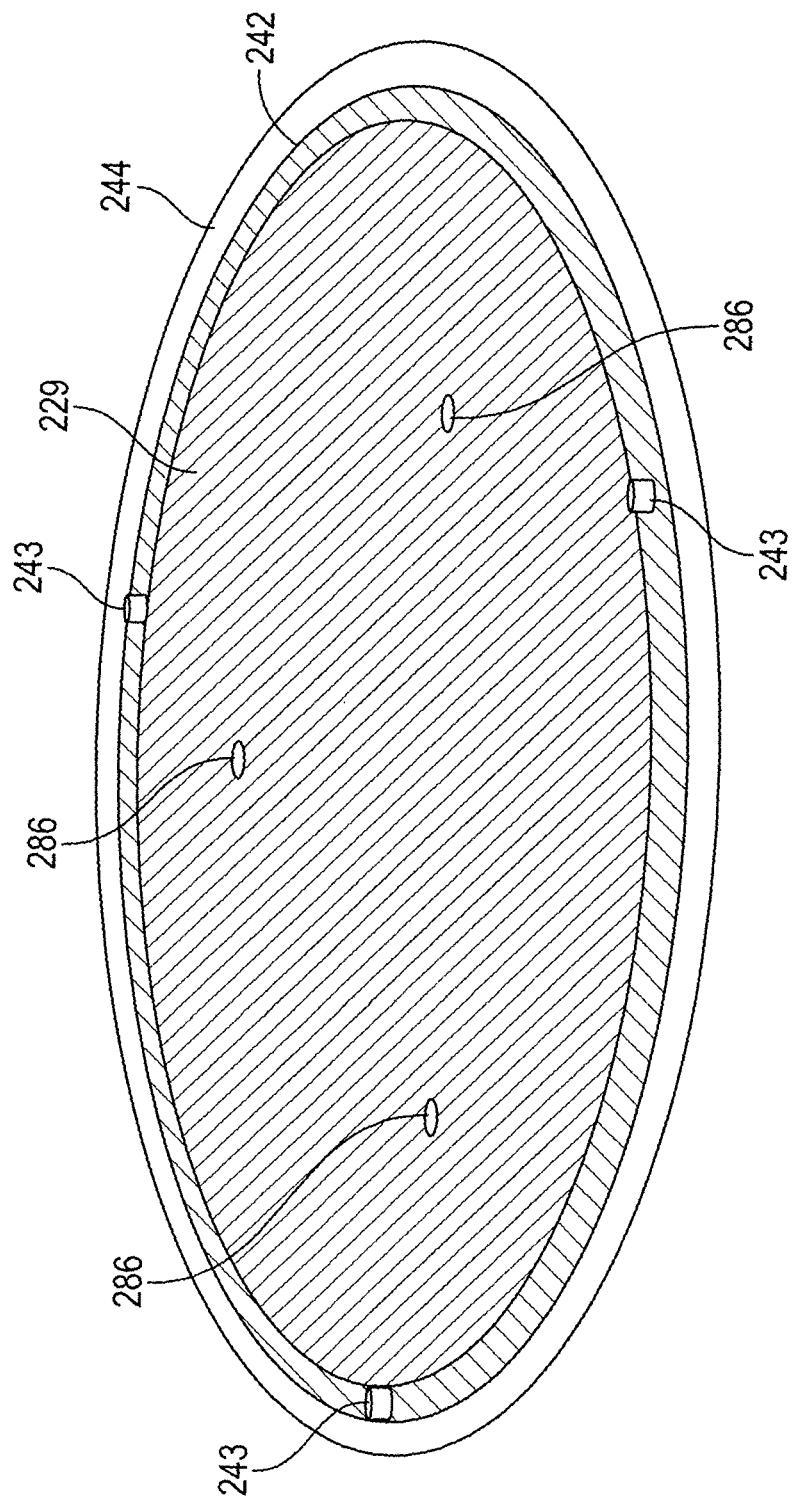
FIG. 3 illustrates a simplified perspective view of an inner ring showing protrusions.

The outer ring 244 is positioned concentrically with respect to the inner ring 242 and the substrate 109. The outer ring 244 assists the inner ring 242 in providing the substrate 109 with lateral support and reducing undesired etching of the inner ring 242. In some examples, the upper surface 245 of the inner ring 242 may be provided with a plurality of protrusions 243 (only one is shown) to prevent the substrate 109 from sliding during the processing. FIG. 3 illustrates a simplified perspective view of the inner ring 242 and the outer ring 244, showing three protrusions 243 are symmetrically disposed around the circumference of the inner ring 242 to confine movement of the substrate 109. It is contemplated that any number of protrusions 243 may be used. The protrusions 243 may be spherical caps, cylinders, raised dots, or have any other suitable geometry. The protrusions 243 may be fabricated from the same or different material from the inner ring 242. In one example, the protrusions 243 are fabricated from silicon carbide.

The substrate support assembly 111 may optionally include one or more actuators 247, such as a stepper motor or linear actuator, among others. For example, the one or more actuators 247 are disposed in the ground plate 226. It is contemplated, however, that the actuator 247 may be positioned externally of the substrate support assembly 111. Each actuator 247 is adapted to engage, or interface with, one or more push pins 248. The one or more push pins 248 extend from the ground plate 226, through the insulating plate 227 and the sleeve 230, and into contact with the outer ring 244. Actuation of the one or more push pins 248 results in vertical actuation, or displacing, of the outer ring 244, the inner ring 242, and the cover ring 246 (if used) relative to an upper surface of the substrate 109. The position of the outer ring 244 may be adjusted to a height which accommodates for erosion of the outer ring 244 in order to increase plasma uniformity across a substrate surface during processing.

The substrate support assembly 111 also includes three or more lift pins 288 for lifting the substrate 109 off the surface of the electrostatic chuck 229. The lift pins 288 extend from the ground plate 226, the insulating plate 227, the facilities plate 228 and through the electrostatic chuck 229 to the respective lift pin hole 286 (FIG. 3). The lift pins 288 are controlled by an actuator 284. Each actuator 284 is adapted to engage, or interface with the lift pins 288 to move them up and/or down.

One or more bellows may be positioned around each of the one or more push pins 248 to reduce particle contamination within the process chamber 100 (shown in FIG. 1). Additionally, one or more push pin guides 239, such as a guide sleeve or bearing, may be positioned in the sleeve 230 disposed around each push pin 248 to facilitate actuation of each push pin 248. The push pin guides 239 provide bearing surfaces for push pins 248. The actuation of push pins 248 can be operably controlled by the controller 155 (shown in FIG. 1).

In one example, the one or more actuators 247 are micro-stepper motors. In another example, the one or more actuators 247 are piezo-electric motors. In one example, the one or more push pins 248 are fabricated from quartz or sapphire.

In one example, the controller may be a general purpose computer that includes memory for storing software. The software may include instructions for detecting erosion of the inner ring 242 and outer ring 244 and then directing the one or more actuators 247 to raise the one or more push pins 248 such that the inner ring 242 and the outer ring 244 are elevated to a desired height.

Figure 4A:
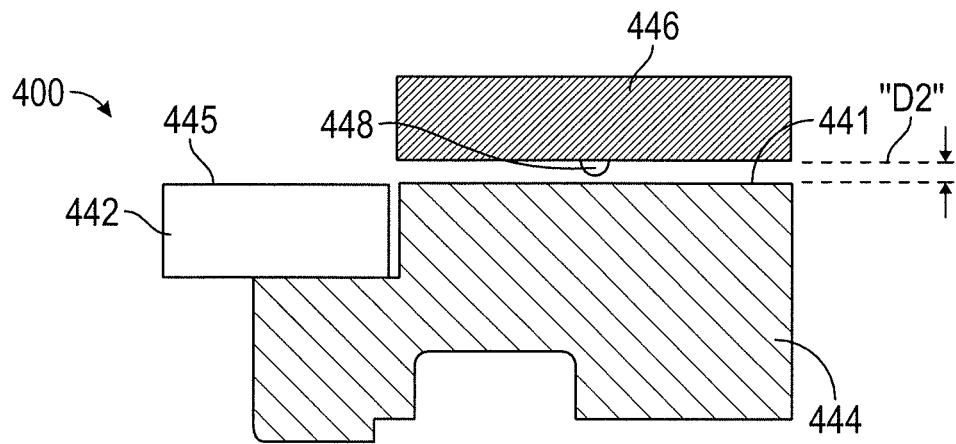
FIG. 4A illustrates a cross-sectional view of a process kit according to one implementation.

FIG. 4A illustrates a cross-sectional view of a process kit 400 according to one implementation. The process kit 400 can be used in place of the process kit 203 of FIG. 2. The process kit 400 includes an inner ring 442, an outer ring 444, and a pumping ring 446. The outer ring 444 is disposed radially outward of the inner ring 442. The inner ring 442 and the outer ring 444 are similar in design as the inner ring 242 and the outer ring 244 except that the entire upper surface 441 of the outer ring 444 and the entire upper surface 445 of the inner ring 442 are coplanar or at the same elevation.

Figure 4B:
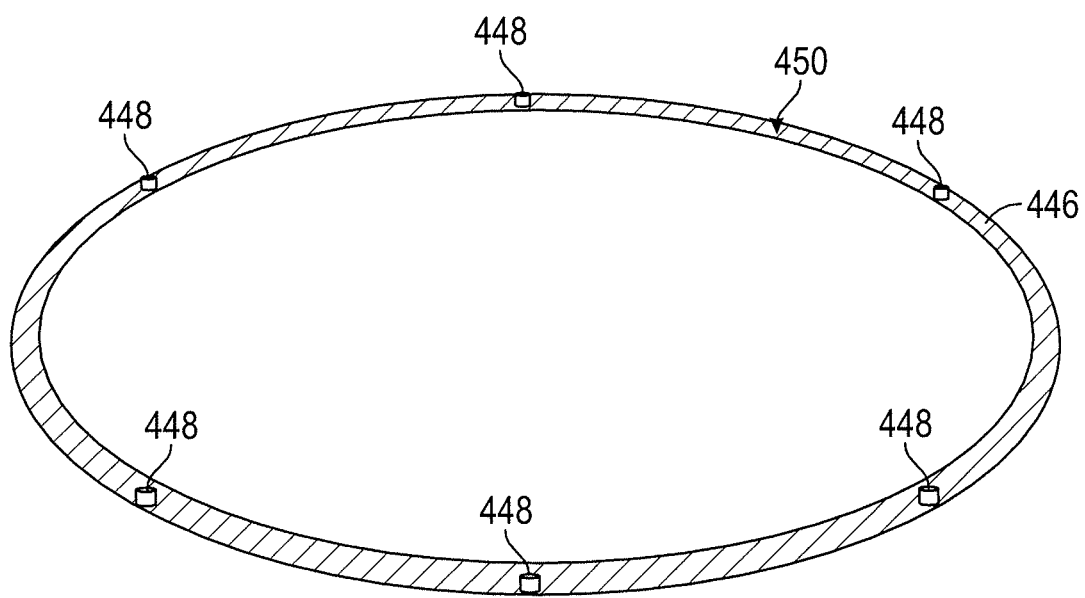
FIG. 4B illustrates a perspective view of a pumping ring showing protrusions.

The pumping ring 446 is disposed over the outer ring 444. The pumping ring 446 may have three or more protrusions 448 disposed at the bottom surface of the pumping ring 446. The protrusions 448 create a gap "D2" between the outer ring 444 and the pumping ring 446 to allow passage of unwanted polymer materials (accumulated between the process kit 400 and the edges of the electrostatic chuck 229), which are then pumped out of the process chamber through the vacuum pump 122 (FIG. 1). The protrusions 448 may be symmetrically arranged around the circumference of the pumping ring 446. FIG. 4B illustrates a perspective view of the pumping ring 446 showing six protrusions 448 are disposed at the bottom surface 450 of the pumping ring 446. Any number of protrusions may be used to obtain desired and/or maximum pumping area.

The gap "D2" may be in a range of about 0.002 inches to about 0.1 inches, such as about 0.010 inches to about 0.050 inches. In alternative implementations, the protrusions 448 can be provided at the upper surface 441 of the outer ring 444 to create the gap "D2" for the same purposes. In either case, the size of gap "D2" can be selected to change pumping efficiency. The pumping ring 446 may be fabricated from quartz, silicon, or any other plasma-resistant material. The inner ring 442 and the outer ring 444 may be fabricated from the same material as the inner ring 242 and the outer ring 244 as discussed above.

Figure 5:
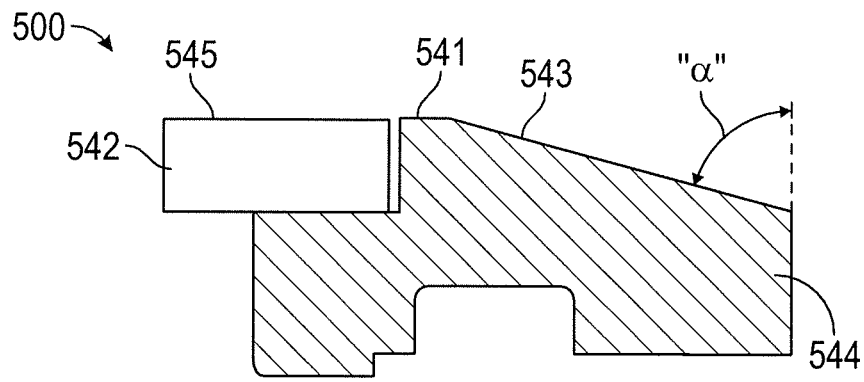
FIG. 5 illustrates a cross-sectional view of a process kit according to one implementation.

FIG. 5 illustrates a cross-sectional view of a process kit 500 according to one implementation. The process kit 500 includes an inner ring 542 and an outer ring 544 disposed radially outward of the inner ring 542. In this implementation, the inner ring 542 and the outer ring 544 are similar in design as the inner ring 242 and the outer ring 244 except that the outer ring 544 has a first upper surface 541 and a second upper surface 543. The first upper surface 541 is coplanar with an upper surface 545 of the inner ring 542. The second upper surface 543 has a slope towards a direction away from the inner ring 542. In some examples, the entire upper surface of the outer ring 544 may be a slope. The longitudinal axis of the second upper surface 543 can be at an angle "α" with respect to a direction extending along an outer peripheral surface 547 of the outer ring 544. In one implementation, the angle "α" is in a range of about 35 degrees to about 85 degrees, such as about 45 degrees to about 75 degrees, for example about 60 degrees. Comparing to outer rings having an entire planar upper surface (e.g., process kit 400), the slope of the second upper surface 543 allows unwanted polymer materials (accumulated between the process kit 500 and the edges of the electrostatic chuck 229) to be pumped to the vacuum pump 122 more efficiently.

Figure 6A:
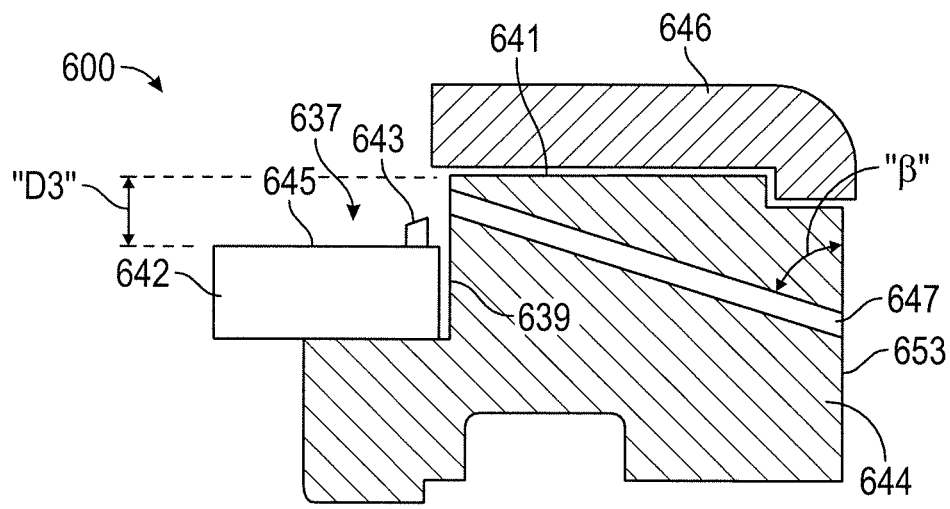
FIG. 6A illustrates a cross-sectional view of a process kit according to one implementation.

FIG. 6A illustrates a cross-sectional view of a process kit 600 according to one implementation. The process kit 600 includes an inner ring 642 and an outer ring 644 disposed radially outward of the inner ring 642. A plurality of protrusions 643 are disposed at an upper surface 645 of the inner ring 642. Similar to the protrusions 243, the protrusions 643 can help positioning of the substrate (not shown) during the process. The process kit 600 may optionally include a cover ring 646 positioned on an upper surface 641 of the outer ring 644. The inner ring 642, the outer ring 644 and the cover ring 646 (if used) are similar in design as the inner ring 242, the outer ring 244, and the cover ring 246 except that the upper surface 641 of the outer ring 644 is higher than the upper surface 645 of the inner ring 642 by a distance "D3". In one implementation, the distance "D3" may be in a range of about 0.01 inches to about 5 inches, such as about 0.1 inches to about 2 inches, for example about 1 inch.

In one implementation, which can be included or combined with any other implementations discussed in this disclosure, the outer ring 644 further includes a plurality of pumping channels 647 formed through the outer ring 644. The pumping channels 647 may extend from a vertical wall 639 of a recess 637 formed in the inner periphery of the upper portion of the outer ring 644, to an outer peripheral surface 653 of the outer ring 644. The pumping channels 647 may be angled downwardly towards a direction away from the inner ring 642. For example, a longitudinal direction of the pumping channels 647 can be at an angle "β" with respect to a direction extending along the outer peripheral surface 653. In one implementation, the angle "β" is in a range of about 30 degrees to about 88 degrees, such as about 40 degrees to about 65 degrees, for example about 50 degrees. The unwanted polymer materials or particles accumulated between the process kit 600 and the edges of the electrostatic chuck 229 can be pumped to the vacuum pump 122 (FIG. 1) through the pumping channels 647.

Figure 6B:
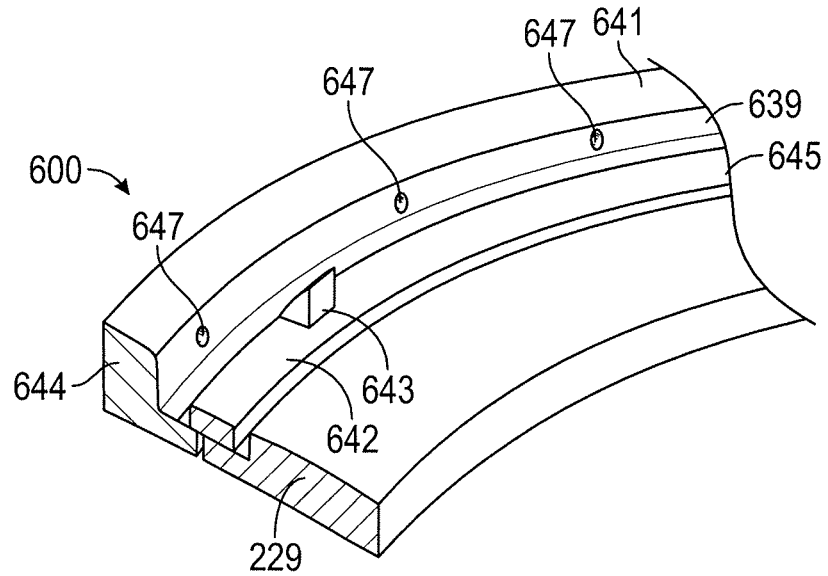
FIG. 6B illustrates a perspective view of a portion of a process kit showing pumping channels.

FIG. 6B illustrates a perspective view of a portion of the process kit 600 showing pumping channels 647 are formed in the vertical wall 639 located at the upper portion of the outer ring 644. The pumping channels 647 may be disposed symmetrically around the circumference of the outer ring 644. The pumping channels 647 may have any suitable shape, such as round, square, triangular, etc. The diameter of the pumping channels 647 may be in a range from about 0.1 inches to about 1 inches.

Implementations of the present disclosure result in improved quality of a substrate being processed in a process chamber as unwanted polymer material accumulated at edges of a process kit and the electrostatic chuck can be exhausted more efficiently through pumping channels formed in an outer ring of the process kit. The improved quality of the substrate leads to an increase in process yield. Furthermore, process chambers making use of the present disclosure experience less downtime for preventative maintenance by extending the usable life of process kit.

Figure 7:
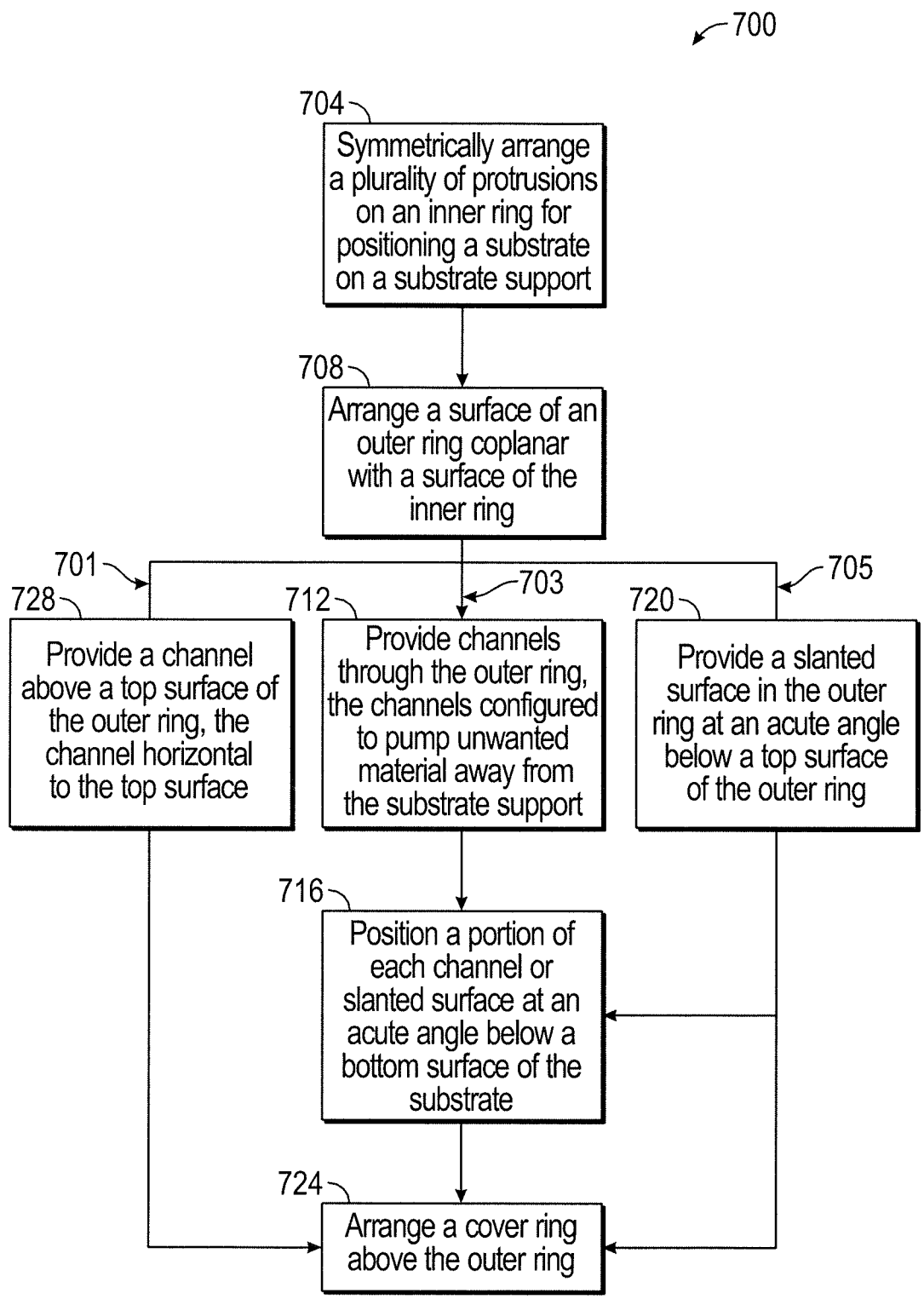
FIG. 7 is a flow chart of an exemplary method of removing contaminants from the surface of the substrate support.

FIG. 7 is a flow chart of an exemplary method 700 of removing contaminants from the surface of the substrate support, i.e. electrostatic chuck 229.

At block 704, the plurality of protrusions 243 is symmetrically arranged on the upper surface 245 of the inner ring 242. As shown in FIGS. 2 and 3, the protrusions 243 are symmetrically disposed around the circumference of the inner ring 242 to confine movement of the substrate 109. At block 708, the upper surface 241 of the outer ring 244 is arranged coplanar with the upper surface 245 of the inner ring 242. As previously stated, pumping of unwanted polymer materials is facilitated by arranging the upper surface 245 of the inner ring 242 coplanar to the upper surface 241 of the outer ring 244. In one configuration illustrated along path 701, the gap D2 (i.e. channel) can be oriented in a horizontal direction to facilitate pumping of unwanted material, as shown in FIG. 4. At block 712, channels 647 are provided through the outer ring 244. As illustrated along path 703, the channels 647 are configured to pump unwanted material away from substrate support (e.g. the electrostatic chuck 229). As noted above, the channels 647 are further configured to pump unwanted material away from the process kit 203. In the example shown in FIGS. 6A-6B, the channels 647 have circular or ovular cross-section areas. In another example, the channels have square or rectangular cross-sectional areas (not shown). At block 716, channels 647 are positioned at an acute angle "β," away from the inner ring 642. A portion of the channel 647 may be positioned below the substrate 109. The substrate 109 is positioned on the upper surface 233 of the electrostatic chuck 229. The upper surface 233 is substantially coplanar to the upper surface 245 of the inner ring 242. As stated above, angle "β," is taken with respect to a direction extending along the outer peripheral surface 653. Path 705 demonstrates another example that includes block 720. At block 720, a slanted surface 543 is provided on the outer ring 244 at an acute angle "α" below the first upper surface 541 of the outer ring 544, as shown in FIG. 5. At block 724, a cover ring 246 is arranged above the outer ring 244. At block 728, the gap D2 is formed between the upper surface 241 of the outer ring 244 and the bottom surface of the pumping ring 446. As noted above, the gap D2 (i.e. channel) allows passage of unwanted polymer materials away from the substrate support and the process kit 400. As shown in FIG. 4, in at least one example, protrusions 448 may be symmetrically arranged around the circumference of the pumping ring 446 (e.g. outer ring 244) creating the gap D2.

While the foregoing is directed to implementations of the present disclosure, other and further implementations of the disclosure may be devised without departing from the basic scope thereof.

The invention claimed is:

1. A substrate support assembly, comprising:
an electrostatic chuck comprising a first recess formed in an upper portion of the electrostatic chuck; and
a process kit surrounding the electrostatic chuck, wherein the process kit comprises:
an inner ring, wherein an upper surface of the inner ring has a plurality of discontinuous protrusions extending from the upper surface of the inner ring, and wherein the protrusions are disposed symmetrically about a circumference of the inner ring; and
an outer ring disposed radially outward of the inner ring, wherein the outer ring comprises a second recess formed in an upper portion of the outer ring, and the inner ring is positioned within and supported by the first recess and the second recess so that the upper surface of the inner ring and an upper surface of the outer ring are coplanar.

2. The substrate support assembly of claim 1, wherein the inner ring is fabricated from silicon.

3. The substrate support assembly of claim 1, wherein the outer ring is fabricated from quartz.

4. The substrate support assembly of claim 1, further comprising:
a pumping ring disposed over the outer ring.

5. The substrate support assembly of claim 4, wherein the pumping ring has a plurality of protrusions disposed at a bottom surface of the pumping ring.

6. The substrate support assembly of claim 1, wherein a top surface of the first recess and a top surface of the second recess are at a same elevation.

7. A substrate support assembly for processing a substrate, the substrate support assembly comprising:
a substrate support;
an electrostatic chuck disposed on the substrate support, wherein the electrostatic chuck comprises a first recess formed in an upper portion of the electrostatic chuck; and
a process kit surrounding the electrostatic chuck, wherein the process kit comprises:
an inner ring, wherein an upper surface of the inner ring has a plurality of discontinuous protrusions extending from the upper surface of the inner ring, and wherein the protrusions are disposed symmetrically about a circumference of the inner ring;
an outer ring disposed radially outward of the inner ring, wherein the outer ring comprises a second recess formed in an upper portion of an upper ring, wherein the inner ring is positioned within and supported by the first recess and the second recess, and an upper surface of the outer ring is higher than the upper surface of the inner ring; and
a plurality of pumping channels formed through the outer ring, wherein the pumping channels are angled downwardly towards a direction away from the inner ring.

8. The substrate support assembly of claim 7, wherein the inner ring is fabricated from silicon.

9. The substrate support assembly of claim 7, wherein the outer ring is fabricated from quartz.

10. The substrate support assembly of claim 7, wherein a longitudinal direction of the pumping channels is at an angle with respect to a direction extending along an outer peripheral surface of the outer ring.

11. The substrate support assembly of claim 10, wherein the angle is in a range of about 30 degrees to about 88 degrees.

12. The substrate support assembly of claim 7, further comprising:
a cover ring disposed over the outer ring.

13. The substrate support assembly of claim 12, wherein the cover ring is fabricated from quartz or silicon.

14. A method of removing particles from a substrate support surface, comprising:
arranging an outer ring, wherein a first upper surface of the outer ring engages a lower surface of an inner ring;
a second upper surface of the outer ring is higher than a top surface of the inner ring, wherein the second upper surface of the outer ring is the top surface of the outer ring; and
the outer ring is disposed radially outward of the inner ring;
symmetrically arranging a plurality of discontinuous protrusions extending from an upper surface of the inner ring for positioning a substrate on a substrate surface; and
forming pumping channels on the outer ring, the pumping channels configured to pump unwanted material away from a substrate support.

15. The method recited in claim 14, further comprising: positioning a portion of each pumping channel at an acute angle below a bottom surface of the substrate.

16. The method recited in claim 14, further comprising: forming a slanted surface in the outer ring at an acute angle below the top surface of the outer ring.

17. The method recited in claim 14, wherein the pumping channels are provided through a surface of the outer ring.

18. The method recited in claim 14, further comprising: arranging a cover ring above the outer ring.

19. The substrate support assembly of claim 1, wherein the upper surface of the inner ring and the upper surface of the outer ring are coplanar with a substrate supporting surface of the electrostatic chuck.

20. The substrate support assembly of claim 7, wherein the upper surface of the inner ring and the upper surface of the outer ring are coplanar with a substrate supporting surface of the electrostatic chuck.

* * * * *